United States Patent
Lyons et al.

(10) Patent No.: US 6,448,164 B1
(45) Date of Patent: Sep. 10, 2002

(54) DARK FIELD IMAGE REVERSAL FOR GATE OR LINE PATTERNING

(75) Inventors: Christopher F. Lyons, Fremont; Ramkumar Subramanian, Sunnyvale; Marina V. Plat; Todd P. Lukanc, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/716,216

(22) Filed: Nov. 21, 2000

(51) Int. Cl.$^7$ ............................................. H01L 21/3205
(52) U.S. Cl. ........................ 438/585; 438/691; 438/717; 438/725; 438/736
(58) Field of Search ................................ 438/725, 736, 438/597, 197, 502, 585, 637, 691, 717, 948, 949

(56) References Cited

U.S. PATENT DOCUMENTS 5,877,076 A * 3/1999 Dai .............................. 438/597

* cited by examiner

*Primary Examiner*—Chandra Chaudhari
*Assistant Examiner*—Jack Chen
(74) *Attorney, Agent, or Firm*—Foley & Lardner

(57) ABSTRACT

A method of forming either a gate pattern or a line pattern in a resist by using a dark field mask and a combination of a negative photoresist and a positive photoresist. The dark field mask is used to create a hole within the positive photoresist, by exposing only a portion of the positive photoresist to light, and then by subjecting the positive photoresist to a developer. The negative photoresist is formed within the hole of the positive photoresist, and etched or polished so that it is only disposed within the hole. The negative photoresist and the positive photoresist are subjected to a flood light exposure, and then to a developer. This causes the positive photoresist to dissolve, leaving the negative photoresist, thereby providing a very-small-dimension resist pattern that can be used to form either a gate or a line for a semiconductor device.

10 Claims, 1 Drawing Sheet

DARK FIELD IMAGE REVERSAL FOR GATE OR LINE PATTERNING

BACKGROUND OF THE INVENTION

1. Field of the Invention

This invention relates generally to gate or line patterning. More particularly, this invention relates to dark field image reversal for gate or line patterning.

2. Description of the Related Art

Semiconductor critical dimensions (CD) are becoming increasingly smaller to accommodate faster, smaller and more powerful semiconductor devices.

Gate and other line patterning are important aspects for forming semiconductor devices. Typically, bright field masking is used in forming gate and line patterns on a photoresist. Bright field masks are masks where most of the mask is transparent with only a fraction of the mask opaque. However, bright field masking has a problem in that lens aberrations and stray light cause imprecise formation of gate and line patterns, due to the optics utilized in the photolithography process. As a result, CD control in forming gate and line patterns, especially for patterns with critical dimensions less than 100 nanometers, is a problem. Bright field masks are also more prone to particle defect printing. This is especially critical in future lithography systems which may not accommodate pellicle protection of the mask.

SUMMARY OF THE INVENTION

Accordingly, it is a general object of the present invention to provide an improved method of forming small contact holes for semiconductor devices.

The above object may be achieved by a method of forming one of a gate pattern and a line pattern for a semiconductor device. The method includes forming a positive resist layer on a substrate. The method also includes irradiating the positive resist layer using a dark field mask, wherein the dark field mask has an opening to allow light to pass therethrough, the opening being equal in size to a dimension of the one of the gate pattern and the line pattern to be formed within the semiconductor device. The method further includes developing the irradiated positive resist layer, so as to remove the irradiated positive resist layer, thereby leaving an opening in the positive resist layer where the irradiated positive resist layer was previously located. The method still further includes applying a negative resist layer to cover the positive resist layer. The method also includes recessing the negative resist so that the negative resist layer exists only within the opening in the positive resist layer. The method further includes exposing the negative resist layer and the positive resist layer to a flood light exposure. The method still further includes applying a developer to the semiconductor device so as to remove the positive resist layer and to harden the negative resist layer. As a result, a resist pattern for forming the one of the gate pattern and the line pattern is formed in a location where the hardened negative resist layer is located.

The above-mentioned object may also be achieved by a method of forming one of a gate pattern and a line pattern for a semiconductor device to be formed on a substrate. The method includes forming a first layer on the substrate, and then forming a positive resist layer on the first layer. The method also includes irradiating the positive resist layer using a dark field mask, wherein the dark field mask has an opening to allow light to pass therethrough, the opening being equal in size to a dimension of the one of the gate pattern and the line pattern to be formed within the semiconductor device. The method further includes subjecting the irradiated positive resist to a developer, so as to remove the irradiated positive resist, thereby leaving an opening in the positive resist layer where the irradiated positive resist layer was previously located. The method still further includes applying a negative resist to cover the first layer and a remaining portion of the positive resist layer. The method also includes recessing the negative resist layer so that the negative resist layer is only disposed within the opening. The method further includes exposing the recessed negative resist layer and the remaining portion of the positive resist layer to a flood light exposure. The method still further includes applying a developer to the semiconductor device so as to dissolve the remaining portion of the positive resist layer and to harden the recessed negative resist layer. As a result, a resist pattern for forming the one of the gate pattern and the line pattern is formed at a location where the hardened negative resist layer is disposed.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DETAILED DESCRIPTION OF THE PREFERRED EMBODIMENT

A major concern in conventional lithographic processes is that the processes are reaching the size limit in gate and line patterning, especially for forming gate and other line patterns with dimensions of 100 nanometers (nm) or less in size. As explained earlier, the conventional gate formation uses a bright field mask in the formation of the gate patterns, which brings in problems associated with lens aberrations, and thereby negatively affects CD control. The lens aberrations affect the CD control for gate and line formation, and removing the problems associated with lens aberrations and stray light is achieved by way of a dark field (DF) mask, so as to improve CD control of a line pattern or a gate pattern. As explained earlier, bright field masks are prone to particle defect printing, and the present invention helps overcome this problem by utilizing a dark field mask.

Figure 1A:
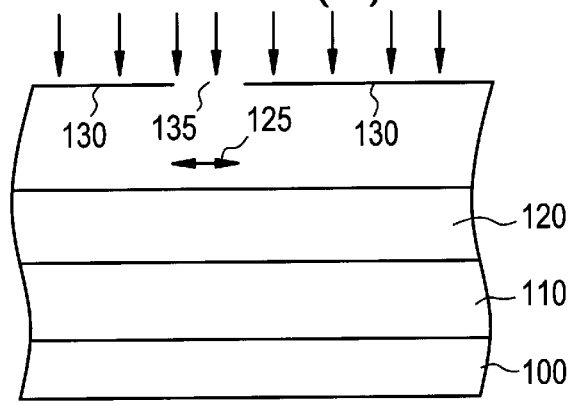
FIGS. 1(a)–1(d) illustrate cross-sectional views of the lithographic process of the present invention.

The present invention will now be described in detail with reference to FIGS. 1(a) to 1(d). FIG. 1(a) shows a semiconductor structure that includes a substrate 100, a conductor or semiconductor layer 110, and a positive photoresist layer 120. The semiconductor layer 110 may be any conventional gate conductor material or a semiconductor, or a metal.

As shown in FIG. 1(a), a DF mask 130 is provided above the semiconductor structure, and the positive photoresist layer 120 is illuminated with light from a light source located above the DF mask 130. As a result, only a small portion of the positive photoresist layer 120 is exposed to the light, which is the portion 125 directly below the opening 135 the DF mask 130. A dark field mask is a mask where most of the mask is opaque with only a fraction of the mask transparent. Generally, the opening 135 will be a transparent region, such as a transparent glass. Alternatively, the opening 135 may be devoid of mask material.

Figure 1B:
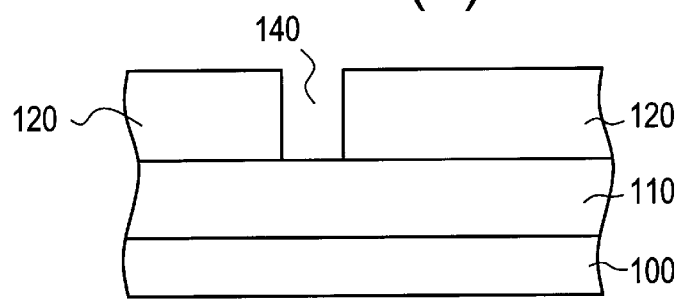

FIG. 1(b) shows the semiconductor structure after the positive photoresist layer 120 has been in contact with a developer solution. The developer solution acts to dissolve the light-exposed portion of the positive photoresist layer 120, leaving a small hole 140 where the light-exposed portion was previously located. Any type of conventional developer solution for removing positive resist may be used in this step.

Figure 1C:
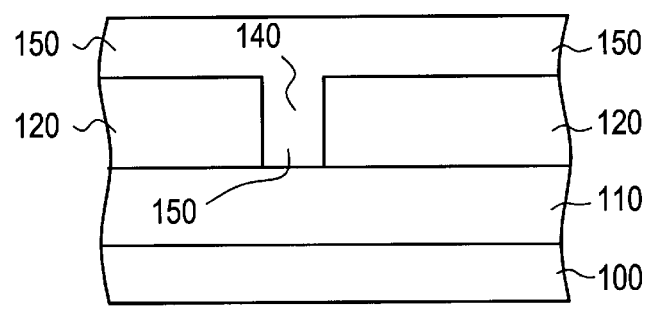

FIG. 1(c) shows the semiconductor structure after a negative photo-resist layer 150 has been formed above and within the small hole 140. A negative photoresist is a resist that acts oppositely from a positive photoresist, in that when a portion of a negative photoresist is exposed to light, it hardens and will not be dissolved when placed in a developer. All non-exposed portions of the negative photoresist will not harden and thus will be dissolved when placed in the developer.

Negative photoresists have typically not been utilized in photolithography as VLSI structures have gotten smaller and smaller, since the resolution capability of these negative resist is poor compared to positive resists. However, the present invention utilizes negative photoresists along with positive photoresists in a novel manner to provide a method for gate and line patterning at very small dimensions.

Referring back to FIG. 1(c), the negative photoresist layer 150 is formed so that its top surface is formed above the top surface of the hardened positive photoresist layer 120. In a preferred construction, the negative photoresist layer 150 is spin-coated onto the semiconductor structure so that its covers the hardened positive photoresist layer 120, as well as filling in the hole 140. The negative photoresist layer 150 is then recessed, such as by etching or by polishing the negative photoresist layer 150, where it is removed from the top surface of the positive photoresist layer 120 and substantially remains only within the hole 140.

Other ways of forming the negative photoresist layer 150 onto the semiconductor structure, besides spin-coating, may be contemplated, while remaining within the scope of the invention. For example, a chemical vapor deposition (CVD) process may be utilized instead.

As shown in FIG. 1(c), a layer that includes a patterned positive photoresist layer 120, and that also includes a negative photoresist layer 150 that is formed within a hole 140 that is surrounded by the patterned positive photoresist layer 120, is provided as a combined layer 120/150 above the conductor or semiconductor layer 110. In the preferred embodiment, the hole 140 is two-dimensional structure having one relatively long dimension and one relatively short dimension, so as to form a pattern for a gate or for a line for a semiconductor device that is being formed on a substrate.

Figure 1D:
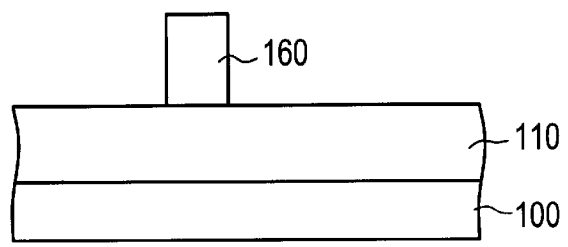

FIG. 1(d) shows the semiconductor structure after the structure has been subject to flood light exposure, i.e., the entire top surface is exposed, and then subject to a developer. The developer used to arrive at the structure shown in FIG. 1(d) may be the same developer used to remove the small portion of the positive photoresist layer 120 to arrive at the structure shown in FIG. 1(b). Referring again to FIG. 1(d), when the developer does not remove the negative photoresist layer 150 that is formed within the hole 140, since it was previously subject to light by way of the flood light exposure. The remaining portion of the positive photoresist layer 120, on the other hand, is dissolved when exposed to the developer, since the flood light exposure changes its characteristics to make it soluble in the developer.

As a result, what remains is a two-dimensional structure 160, formed in the hole 140 where the hardened photoresist layer 150 is located. The two-dimensional structure 160 corresponds to a resist pattern that is used to form a very small dimension gate or a line pattern. Since a dark field mask is used in the formation of the gate or line pattern according to the present invention, lens aberrations and stray light are reduced and excellent control can be achieved in such small-size resist patterning (e.g., less than 100 nm). Such control is not readily accomplished by the conventional methods that use a bright field mask to form gate and line patterns in a resist, since bright field masks are prone to particle defect printing, as explained earlier.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

We claim:

1. A method of forming one of a gate pattern and a line pattern for a semiconductor device, comprising:

forming a conductor or semiconductor layer on a substrate, and then forming a positive resist layer on the conductor or semiconductor layer;

selectively irradiating the positive resist layer using a dark field mask to form an irradiated positive resist layer, wherein the dark field mask has an opening to allow light to pass therethrough, the opening being equal in size to a dimension of the one of the gate pattern and the line pattern to be formed within the semiconductor device;

developing the irradiated positive resist layer, so as to remove the irradiated positive resist layer, thereby leaving an opening in the positive resist layer where the irradiated positive resist layer was previously located;

applying a negative resist layer to cover the positive resist layer;

recessing the negative resist layer so that the negative resist layer exists only within the opening in the positive resist layer;

exposing the negative resist layer and the positive resist layer to a flood light exposure; and applying a developer to the semiconductor device so as to remove the positive resist layer, wherein a resist pattern for forming the one of the gate pattern and the line pattern is formed in a location where the negative resist layer is located.

2. The method according to claim 1, wherein the negative resist layer is recessed by etching back the negative resist layer.

3. The method according to claim 1, wherein the negative resist layer is recessed by polishing the negative resist layer.

4. The method according to claim 1, wherein the negative resist layer is formed by way of a negative photoresist.

5. The method according to claim 4, wherein the positive resist layer is formed by way of a positive photoresist.

6. A method of forming one of a gate pattern and a line pattern for a semiconductor device to be formed on a substrate, comprising:

forming a first layer on the substrate, and then forming a positive resist layer on the first layer;

selectively irradiating the positive resist layer using a dark field mask to form an irradiated positive resist layer, wherein the dark field mask has an opening to allow light to pass therethrough, the opening being equal in size to a dimension of the one of the gate pattern and the line pattern to be formed within the semiconductor device;

subjecting the irradiated positive resist layer to a developer, so as to remove the irradiated positive resist layer, thereby leaving an opening in the positive resist layer where the irradiated positive resist layer was previously located;

applying a negative resist to cover the first layer and a remaining portion of the positive resist layer;

recessing the negative resist layer so that the negative resist layer is only disposed within the opening of the positive resist layer;

exposing the recessed negative resist layer and the remaining portion of the positive resist layer to a flood light exposure to thereby harden the recessed negative resist layer; and applying a developer to the semiconductor device so as to dissolve the remaining portion of the positive resist layer leaving the hardened recessed negative resist layer;

wherein a resist pattern for forming the one of the gate pattern and the line pattern is formed at a location where the hardened negative resist layer is disposed.

7. The method according to claim 6, wherein the negative resist layer is recessed by etching back the negative resist layer.

8. The method according to claim 6, wherein the negative resist layer is recessed by polishing the negative resist layer.

9. The method according to claim 6, wherein the negative resist layer is formed with a negative photoresist.

10. The method according to claim 6, wherein the positive resist layer is formed with a positive photoresist.

* * * * *